United States Patent [19]

Haase, Jr.

[11] 4,266,262

[45] May 5, 1981

[54] VOLTAGE CONTROLLED POWER SUPPLY FOR ELECTROSTATIC COATING APPARATUS

[75] Inventor: Martin O. Haase, Jr., Boulder, Colo.

[73] Assignee: Binks Manufacturing Company, Franklin Park, Ill.

[21] Appl. No.: 53,372

[22] Filed: Jun. 29, 1979

[51] Int. Cl.³ .................................................. B05B 5/02
[52] U.S. Cl. .................................... 361/228; 118/663; 239/691; 323/235
[58] Field of Search ......................... 118/663; 239/691; 307/252 UA; 323/4, 18, 21, 225 C, 24; 361/57, 225–228; 363/59–61

[56] References Cited

U.S. PATENT DOCUMENTS

| | | | |
|---|---|---|---|
| 3,048,498 | 8/1962 | Juvinall et al. | 118/8 X |
| 3,504,204 | 3/1970 | Carrive | 307/252 UA |
| 3,544,844 | 12/1970 | Pellegrino | 361/57 |
| 3,599,038 | 8/1971 | Skidmore | 363/61 X |
| 3,735,241 | 5/1973 | O'Sullivan | 307/252 UA |
| 3,893,006 | 7/1975 | Algeri et al. | 361/227 |
| 3,917,962 | 11/1975 | Pascente | 323/21 X |
| 3,927,349 | 12/1975 | Suhren et al. | 307/252 UA |
| 3,950,657 | 4/1976 | Sheng et al. | 307/252 UA |
| 4,000,443 | 12/1976 | Lever | 361/228 |
| 4,075,677 | 2/1978 | Bentley | 361/57 X |

OTHER PUBLICATIONS

GE Application Note 200.62, "Photon Couplers", Jun. 1972, pp. 13, 19, 20.

Primary Examiner—A. D. Pellinen
Attorney, Agent, or Firm—Gary, Juettner & Pyle

[57] ABSTRACT

A power supply for generating a high unidirectional voltage at a charging electrode of an electrostatic spray coating apparatus has circuitry for sensing the magnitude of current flow to the electrode and for controlling application of an input voltage to the power supply in accordance therewith to control the magnitude of the high voltage. The arrangement is such that whenever the current flow is less than a predetermined value all cycles of the input voltage are applied to the power supply, but whenever the current exceeds the predetermined value only a limited number of the cycles are applied to the power supply. In this manner, the danger of arcing between the electrode and an article being coated is eliminated or at least significantly reduced.

14 Claims, 3 Drawing Figures

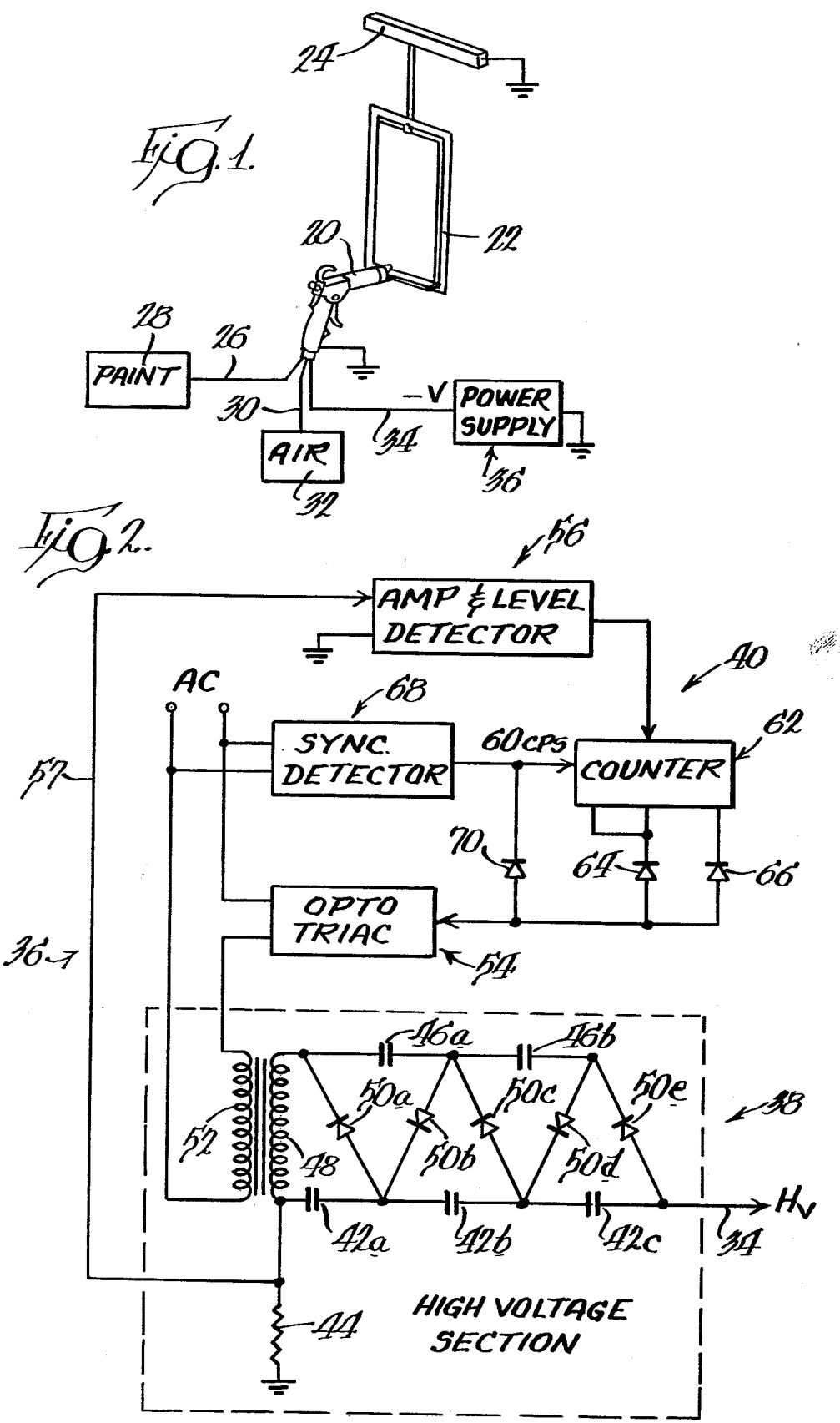

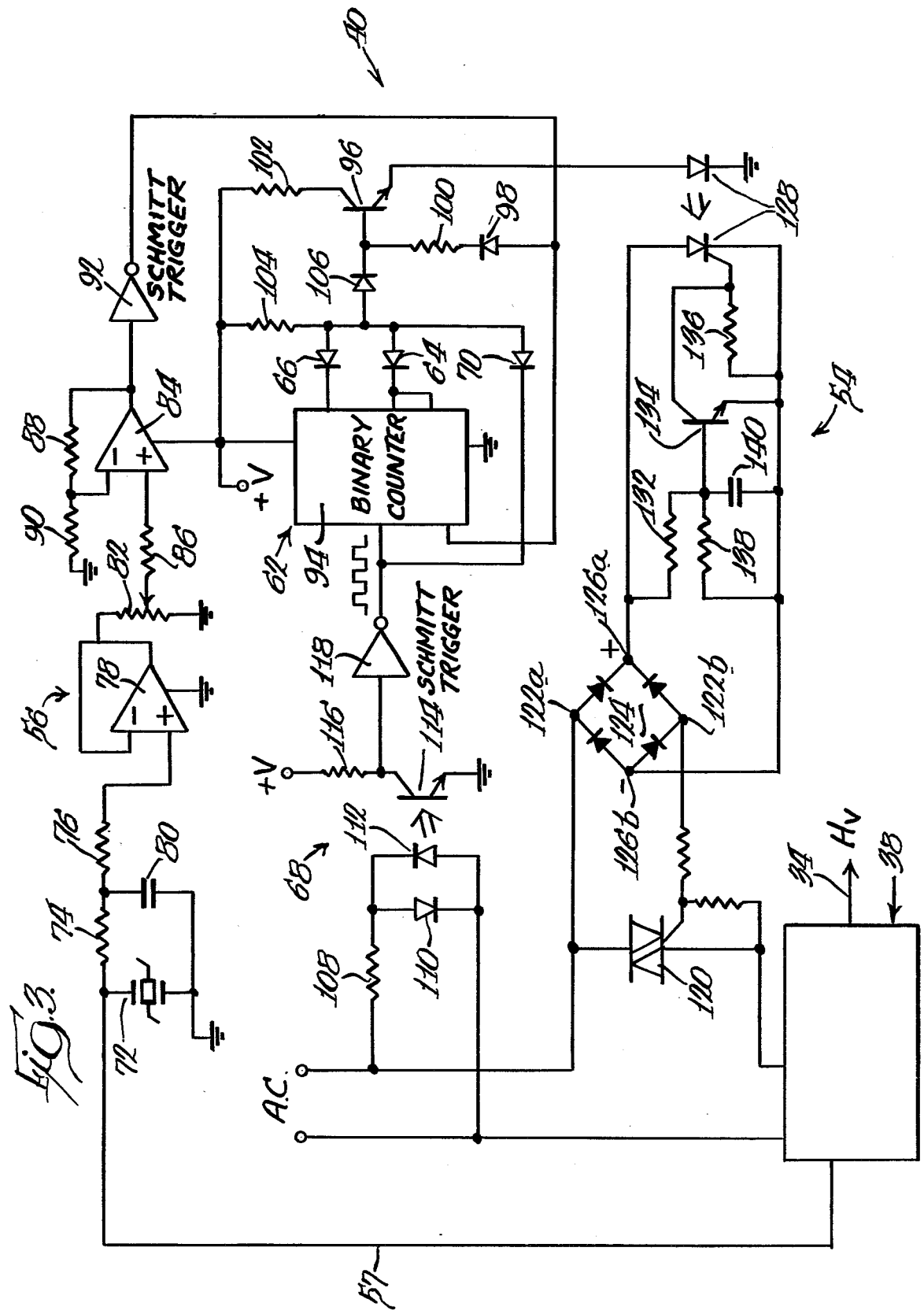

VOLTAGE CONTROLLED POWER SUPPLY FOR ELECTROSTATIC COATING APPARATUS

BACKGROUND OF THE INVENTION

The present invention relates to a voltage controlled power supply for use with spray coating systems wherein electrostatic forces are utilized to aid in the deposition of spray particles on articles to be coated.

Electrostatic spray coating systems are widely used for the application of spray particles on articles to be coated. Such systems normally include a spray gun for which coating material is issued in atomized form, and means, such as an electrode to which a unidirectional high voltage is applied, associated with the spray gun for imparting a charge to the atomized material and for establishing a potential gradient between the spray gun and the article so that electro-static forces aid in transfer of the material to the article. Such spray guns maybe of the automatic type in which the gun is mechanically mounted and articles conveyed therepast, or the gun may be hand held. In addition, with such spray guns atomizing of the coating material may be accomplished in several different ways, for example by using air or hydrostatic forces as an atomizing medium, or by feeding the coating material to a rotary member which forms the material into a film and moves the film to the edge of the member whereat atomization takes place.

Spray coating systems of the type referred to readily lend themselves to commercial use and are capable of greatly reducing the costs of spray painting through the avoidance of coating material losses and the reduction in other costs, including labor of coating. However, such systems suffer a limitation in that proper electrostatic atomization and efficient deposition of spray coatings require an electrostatic field established by relatively high voltages, for example on the order of 60,000 volts and more, which presents difficulties in respect of arcing which may occur between the spray coating systems and the articles to be coated or other nearby objects.

As many spray coating materials are inflammable, particularly when atomized in air, it has heretofore been necessary to maintain a minimum spacing between the spray gun and the article to be coated in order to avoid the likelihood of an arc of sufficient intensity to initiate a fire or explosion. For installations in which the spray gun is mechanically mounted and articles to be coated are moved therepast on a conveyor, the gun is maintained in a generally fixed position with relation to the articles and there is little difficulty in maintaining the minimum spacing therebetween. However, for spray guns which are of the hand held type and manually manipulatable, there is no means to ensure that the minimum spacing will be maintained.

Typical of prior art attempts to avoid arcing between a spray gun and an article is that disclosed in Juvinall et al U.S. Pat. No. 3,048,498. As disclosed therein, a high impedance is connected in circuit between the charging electrode and an output from a high voltage power supply, and causes the voltage at the electrode to decrease with decreases in distance between the electrode and the article. In addition, an inductive-capacitive network at an input to the power supply attenuates the value of an a.c. voltage at the input to progressively decrease the high voltage output from the power supply in response to increases in output current.

Although efforts of the type disclosed in the aforementioned Juvinall et al patent have proven successful in decreasing the incidence of arcing from the charging electrode itself, as a result of the strong electrostatic field significant charges nevertheless accumulate on other portions of the gun, and usually on the atomizing portion which is normally in close proximity with the electrode, and are capable of arcing to an object brought in proximity therewith. Although considerable effort has been made to control such arcing through the geometric design of the spray gun, such efforts have not proven successful and arcing continues to be a problem.

OBJECTS OF THE INVENTION

An object of the present invention is to provide a power supply for an electrostatic spray coating apparatus, the output voltage of which is controlled in accordance with current drawn by the apparatus in a manner which prevents or significantly minimizes arcing between the apparatus and an article to be coated or other nearby objects.

A further object of the present invention is to provide such a power supply in which an a.c. line voltage input to the power supply is selectively interrupted in accordance with the current drawn by the electrostatic spray coating apparatus being above or below a predetermined value.

SUMMARY OF THE INVENTION

In accordance with the present invention, an apparatus for electrostatically depositing a liquid coating material on an article comprises a source of unidirectional high potential and a charging electrode connected to said source to establish an electrostatic field between said electrode and the article, wherein the distance between said charging electrode and the article is subject to variations which can cause a change in the potential gradient between said electrode and the article and a corresponding change in the current flow to said electrode from said source. Means are provided for atomizing liquid coating material into the electrostatic field for movement toward the article in response to the electrostatic field, and to prevent arcing between said electrode and the article means are also included for monitoring the value of the current flow to said electrode and for controlling application of input power to said source in accordance therewith to change the magnitude of the unidirectional high potential. Said monitoring and controlling means continuously connects input power to said source whenever the current flow has less than a predetermined value, so that the high potential has an upper value, and intermittently interrupts application of input power to said source whenever the current flow has at least said predetermined value, so that the high potential has a lower value.

The invention also provides a method of electrostatically spray coating articles in an electrostatic field generated by a unidirectional high potential between a charging electrode and another electrode which may comprise at least one of the articles, wherein the distance between the charging electrode and the other electrode is subject to variations which can cause a change in potential gradient between the charging electrode and the other electrode and a corresponding change in a current flow from the charging electrode. To this end, the method comprises the steps of applying an input voltage to a power supply for generating the unidirectional high potential at an output therefrom, applying the high potential to the charging electrode to generate the electrostatic field, and atomizing liquid coating material into the electrostatic field for movement toward the other electrode in response to the field. In order to prevent the occurrence of arcing between the charging electrode and the other electrode, also included are the steps of monitoring the value of the current flow to the charging electrode, and controlling application of the input voltage to the power supply in accordance with the current flow being less than or at least equal to a predetermined value, whereby the magnitude of the high potential output from the power supply is controlled. In this connection, the controlling step comprises continuously applying the input voltage to the power supply whenever the electrode current flow is less than the predetermined value, and intermittently interrupting application of the input voltage to the power supply whenever the current flow is at least equal to the predetermined value.

The foregoing and other objects, advantages and features of the invention will become apparent upon a consideration of the following detailed description, when taken in conjunction with the accompanying drawings.

BRIEF DESCRIPTION OF THE DRAWINGS

FIG. 1 is a perspective view of a system for electrostatically depositing coating material on articles;

FIG. 2 is a circuit representation of a power supply for use in the system of FIG. 1, and shows in schematic form a high voltage section of the power supply and in block diagram form a circuit for controlling the output voltage from the high voltage section in accordance with the current provided thereby, and FIG. 3 is a schematic circuit representation of the control circuit shown in FIG. 2.

DETAILED DESCRIPTION

The electrostatic spray painting system illustrated in FIG. 1 comprises an electrostatic spray gun 20 positoned to spray a series of articles 22 transported through a coating zone by a conveyor 24. The gun 20 is adapted to be held in the hand of an operator and to be manipulated as necessary to spray coat the articles passing through the coating zone. Paint is supplied to the gun through a flexible hose 26 extending from a paint supply tank 28 maintained under pressure, and the particular spray gun as illustrated employs compressed air for atomizing the paint, with air under appropriate pressure being supplied through a flexible air line 30 from a source 32. High voltage for charging the spray issuing from the gun is conducted to the gun through a flexible cable 34 connected to a high voltage output terminal of a high voltage source or power supply, indicated generally at 36, the other terminal of which is grounded. The articles 22 to be painted are maintained at a spray attracting potential, for example by connecting them electrically to the conveyor 24 which is grounded. The output voltage from the power supply is negative with respect to ground, and is preferably on the order of 60,000 volts.

The power supply 36 is illustrated in greater detail in FIG. 2, and includes a high voltage section and a control circuit therefor indicated respectively at 38 and 40. The high voltage section 38 is of the "ladder" type, with one leg or side of the ladder comprising three capacitors 42*a–c* connected in series with each other and with a resistor 44 between ground and the high voltage output terminal of the power supply. The other leg of the ladder comprises a pair of capacitors 46*a–b* connected in series between one terminal of a transformer secondary winding 48 (the other terminal of which is connected to the capacitor 42*a*) and the cathode of a diode 50*e*. Intermediate the two legs are a plurality of alternately oppositely connected diodes 50*a–e*, which form cross-connections between the legs of the ladder network. In operation of a network of this type, when a voltage is developed across the transformer secondary winding 48 it results in charging the capacitor 42*a*. When the polarity of the voltage across the secondary winding reverses, the voltage impressed upon the capacitor 46*a* is supplemented by voltage and current delivered from the capacitor 42*a* through the diode 50*b*. As the process continues up the ladder, an output voltage is developed which is many times multiplied over the maximum a.c. voltage developed across the secondary winding.

To develop the voltage across the secondary winding 48, a primary winding 52 of the transformer is connected with a.c. line voltage through an optical triac circuit, indicated generally at 54, of the control section 40. In a normal mode of operation of the power supply the optical triac circuit continuously connects the line voltage across the primary winding, so that full voltage is generated at the output from the high voltage section 38. In accordance with the present invention, however, means are provided for sensing the value of the output current from the power supply and provided to a conventional charging electrode (not shown) of the spray gun 20, and for controlling connection of the line voltage through the optical triac circuit and to the high voltage section in accordance therewith in order to limit the output voltage from the power supply and and to thereby limit the current flow. This prevents dangerous or disruptive arcing between the spray gun and the article 22 or another object in close proximity with the gun, and yet enables efficient electrostatic deposition of coating material on the article.

In accomplishing the foregoing, the control section 40 also includes an amplifier and current level detector circuit, indicated generally at 56, which receives at an input thereto over a conductor 57 a voltage at the juncture between the capacitor 42*a* and the resistor 44. The voltage at the juncture is a direct function or derivative of the current provided to the charging electrode of the spray gun, so that the signal at the input to the amplifier and current level detector circuit is representative of the value of the current flow from the power supply and to the electrode. For example, the values of the resistors could be chosen so that one volt at the input to the amplifier and current level detector circuit represents a 250 microamp current flow to the electrode.

An output from the amplifier and current level detector 56 is applied to a reset/enable input to a counter circuit, indicated generally at 62, the outputs from which are coupled through a pair of diodes 64 and 66 to an input to the optical triac circuit 54. A clock input to the counter 62 receives clock pulses at the a.c. line voltage frequency from a synchronizing or sync detector circuit, indicated generally at 68, an input to which is coupled with the a.c. line voltage, and a diode 70 at the output from the sync detector is coupled with the input to the optical triac circuit.

The arrangement is such that for power supply output current levels below a predetermined value, for example below 75 microamps, the output from the amplifier and current level detector 56 maintains the counter circuit 62 in a reset condition and all of the cycles of the a.c. line voltage are connected by optical triac circuit 54 across the primary transformer winding 52, whereby the high voltage power supply section 38 generates full output voltage. However, should the output current be at least equal to the predetermined value, then the output from the amplifier and current level detector circuit enables the counter circuit to respond to output pulses from the sync detector to control operation of the optical triac circuit so that it cyclically applies across the primary transformer winding only a selected proportion of the cycles of the a.c. line voltage. This decreases the voltage, and therefore the current, at the output from the power supply.

FIG. 3 illustrates the power supply control section 40 in greater detail. As shown, the amplifier and current level detector circuit 56 includes a metal oxide varistor 72 connected between ground and the voltage input to the circuit at the conductor 57. A pair of resistors 74 and 76 are in series between the input to the circuit and a noninverting input to an operational amplifier (op amp) 78 which operates as a voltage follower, and a capacitor 80 is between the juncture of the resistors and ground. The output from the op amp is applied across a potentiometer 82, and a noninverting input to an op amp 84 is connected with the slider of the potentiometer through a resistor 86. The op amp 84 operates as a voltage amplifier by means of a pair of resistors 88 and 90 connected in series between the output from the op amp and ground and at a juncture therebetween with an inverting input to the op amp, and the output from the op amp is applied to an inverting Schmitt trigger circuit 92.

In operation of the amplifier and current level detector circuit 56, when the current at the output from the high voltage section 38 is less than a predetermined value as determined by the setting of the potentiometer 82, the output from the Schmitt trigger 92 is at an inactive positive level. However, should the current flow at least equal the predetermined valve, the output from the Schmitt trigger changes to an active ground level. To this end, when the magnitude of the voltage at the input to the amplifier and level detector circuit is relatively low and represents a current flow to the charging electrode of less than the predetermined value, the outputs from the op amps 78 and 84 are relatively low and maintain the output from the Schmitt trigger at an inactive positive level. Upon the electrode current increasing to at least the predetermined value, however, the voltage at the input to the amplifier and current level detector circuit increases sufficiently to cause the outputs from the op amps 78 and 84 to increase to a level which switches the state of the Schmitt trigger output to an active ground level.

The output from the Schmitt trigger 92 is applied both to a reset/enable input to a binary counter 94 of the counter circuit 62 and to the base of an npn transistor 96 through a diode 98 and a resistor 100. A positive voltage is applied to the collector of the transistor 96 through a resistor 102 and is coupled to the base through a resistor 104 and a diode 106, and the dodes 64 and 66 are connected between the outputs from the counter and the juncture between the resistor 104 and diode 106. The counter receives at its clock input pulses from the sync detector circuit 68, the input to which is coupled with the a.c. line by means of a resistor 108, a diode 110 and a photodiode 112. The photodiode is illuminated on alternate half cycles of the a.c. line voltage, and is photocoupled with the base of a phototransistor 114 connected at its collector with positive voltage through a resistor 116 and at its emitter with ground. An inverting Schmitt trigger 118 connects at its input with the collector of the transistor and at its output with the clock input to the counter, and the diode 70 is between the clock input and the juncture between the resistor 104 and the diode 106. The sync detector circuit generates a series of square wave pulses at the output from the Schmitt trigger 118, the positive going edges of which occur at the positive going zero crossing points of the a.c. line voltage.

For controlling application of a.c. line voltage to the high voltage section 38 of the power supply 36, the optical triac circuit 54 includes a triac 120 in circuit between one side of the a.c. line and the primary winding 52 of the high voltage section. The gate and anode of the triac are across a pair of a.c. terminals 122a and 122b of a full wave rectifier 124, the arrangment being such that when a circuit is established between a pair of d.c. terminals 126a and 126b the triac is enabled to conduct line voltage to the primary winding. The terminal 126a is connected to the anode of a photocoupled SCR 128, the terminal 126b with the cathode, and the SCR is coupled wiith the emitter of the transistor 96 for being enabled to conduct whenever the transistor conducts. Thus, whenever the SCR is rendered conductive by the transistor 96 a circuit is established between the d.c. terminals 126a and 126b of the rectifier so that the triac 120 applies a.c. line voltage to the high voltage section of the power supply.

To further control conduction of the photocoupled SCR, a resistor 132 is between the terminal 126a and the base of a transistor 134, and the collector of the transistor is connected both with the gate of the SCR and with the terminal 126b through a resistor 136. The emitter of the transistor is also connected to the terminal 126b, and a resistor 138 and a capacitor 140 are in parallel between the base of the transistor and the terminal. In operation of the optical triac circuit 54, whenever the transistor 96 is conductive the SCR is conductive to complete a circuit between the rectifier terminals 126a and 126b so that the triac 120 applies a.c. line voltage across the primary winding 52 of the power supply high voltage section. Upon the transistor 96 becoming nonconductive, however, the SCR becomes nonconductive at the next zero crossing of the a.c. line voltage, with the transistor 134 at this time dragging down the gate current of the SCR to ensure shutoff at the zero crossing point of the line voltage, and with the filter capacitor 140 preventing application of transient voltages to the base of the transistor.

The overall operation of the power supply control section 40 may now be appreciated. With the voltage at the input to the amplifier and current level detector circuit 56 being representative of the current supplied by the high voltage section 38 to the charging electrode of the spray gun 20, whenever the current is less than a predetermined value, for example 75 microamps, the output from the Schmitt trigger 92 is at a positive level. Under this condition, the counter 94 is maintained in a reset condition whereat all of its outputs exhibit a ground level signal and the transistor 96 is continuously rendered conductive through the diode 98 and the resistor 100. This maintains the photocoupled SCR 128 continuously conductive to complete the circuit between the terminals 126a and 126b of the full wave rectifier 124 so that the triac 120 is enabled to connect all cycles of the a.c. line voltage to the high voltage section 38.

Consequently, whenever the output current from the power supply to the charging electrode is less than the predetermined value, full line voltage is applied to the input to the power supply and the power supply generates full voltage at its output.

Should the value of the current flow from the high voltage section increase to at least the predetermined value, perhaps as the charging electrode closely approaches the article or another object, the output from the Schmitt trigger 92 goes to ground. When this occurs, the diode 98 is reverse biased and the counter is enabled to respond to pulses at its clock input from the Schmitt trigger 118 of the sync detector circuit 68. The counter is then cyclically advanced through a count by the leading, positive going edges of pulses from the sync detector circuit, and simultaneously generates a positive level signal at each of its outputs once in response to each occurrence of a selected number of pulses. At all other times the counter provides a ground level signal at least one of its outputs.

Assume that the counter, when enabled, simultaneously generates a positive level signal at each of its outputs once in response to each occurrent of four pulses from the sync detector circuit. That is, all of the counter outputs are simultaneously positive once in every four counts. Thus, upon the occurrence of an electrode current flow of at least the predetermined value, the counter is enabled, the diode 98 is reverse biased and, except for when all of the counter outputs are positive, the diode 106 is also reverse biased. When both of the diodes 98 ad 106 are reverse biased, the transistor 96 is nonconductive and, therefore, the SCR 128 becomes nonconductive with the next zero crossing of the a.c. line voltage to interrupt application of input power to the high voltage section of the power supply. This decreases the voltage at the power supply output, and therefore decreases the current flow provided to the charging electrode.

For as long as the electrode current flow is at least equal to the predetermined value, the transistor 96 is nonconductive for three out of every four cycles of the a.c. line voltage, since for three out of four cycles at least one of the counter outputs is at ground. Once very fourth cycle, however, all of the counter outputs simultaneously become positive and, along with a positive level of the then occurring pulse from the sync detector circuit which reverse biases the diode 70, enable the positive voltage to be applied through the resistor 104 and diode 106 to render the transistor 96, and therefore the SCR 128, conductive. One full cycle of a.c. line voltage is then applied through the triac 120 to the high voltage section of the power supply. When the then occurring pulse from the sync detector goes to ground the diode 70 is again forward biased, which removes the positive potential from the base of the transistor 96 so that SCR becomes nonconductive at the next positive going zero crossing of the line voltage. The cycle is then repeated, whereby the triac conducts for only one out of every four cycles of the line voltage. Thus, whenever the charging electrode current flow is at least equal to the predetermined value, the a.c. voltage input to the power supply is cyclically and intermittently interrupted so that the output voltage from the power supply, and therefore the voltage at and current flow to the charging electrode, are decreased.

It should be noted that the triac 120 is switched on and off only at zero crossing points of the a.c. line voltage in order to eliminate surge currents and transients. This may be appreciated if it is considered that the counter 94 is advanced or sequenced by the positive going leading edge of such pulse from the sync circuit, which occurs at the positive going zero crossing point of the line voltage. Consequently, when enabled the counter is periodically advanced to the state rendering the triac 120 conductive only at positive going zero crossing points of the line voltage. Thereafter, the transistor 134 ensures shutoff of the SCR and the triac at a subsequent positive going zero crossing point of the line voltage.

The invention thus provides a novel voltage controlled power supply for use with electrostatic coating apparatus. In use of such apparatus with conventional power supplies, it has been found that unless a minimum distance is maintained between the apparatus and an article an electical discharge or arc may occur between the charging electrode and the article or, should a sufficient capacitive charge accumulate on other portions of the apparatus, between those portions and the article. It has also been found that as the distance between the apparatus and the article decreases the current supplied to the charging electode increase, and that such an increased current flow increases the likelihood of arcing.

With the power supply of the invention, however, protection is afforded against arcing bewteen the coating apparatus and an article even when the same are moved closely together. To this end, the amplifier and current level detector circuit 56 is adjusted to respond to that level of electrode current flow which occurs when the coating apparatus approaches the minimum distance from the article at which arcing is likely. Accordingly, for distances between the apparatus and the article in excess of the minimum, full output voltage is provided by the power supply for efficient electrostatic deposition of coating material onto the article. However, should less than the minimum distance exist between the apparatus and the article, the input voltage to the power supply is then periodically interrupted to decrease the magnitude of the high voltage at the output from the power supply and the current flow to the charging electrode. This eliminates or at least minimizes the possibility of disruptive arcing between the apparatus and the article.

Another advantage of the power supply resides in the same being generally self-protecting in the event that a short occurs in the voltage supply cable to the spray gun, since the power supply would respond to such a short in the same manner as to excessive electrode current. Also, insulation damage in the cable cannot occur because of continuous shorting of the electrode, for example as might be caused by an overly conductive coating fluid. In addition, inherent in operation of the power supply is an additional margin of safety to personnel who might accidentally contact the electrode.

While one embodiment fo the circuit has been described in detail, it is understood that various modifications and other embodiments thereof may be devised by one skilled in the art without departing from the spirit and the scope of the invention, as defined in the appended claims.

What is claimed is:

1. Apparatus for electrostatically depositing coating material on an article, comprising a source of unidirectional high potential having an input for receiving input power and an output whereat the unidirectional high potential is generated; a charging electrode connected to said source output to establish an electrostatic field between said electrode and the article; means for atomizing coating material into the electrostatic field for movement toward the article in response to the electrostatic field, the distance between said charging electrode and the article being subject to variations which can cause a change in the potential gradient between said electrode and the article and a change in a current flow to said electrode from said source; and means for monitoring the value of the current flow to said electrode and for controlling application of input power to said source in accordance therewith, said monitoring and controlling means continuously connecting input power to said source input upon the current flow to said electrode having less than a predetermined value so that the unidirectional high potential has a full value, and cyclically interrupting application of input power to said source input so that only a portion and less than all of the input power is applied to said source input whenever the current flow to said electrode has at least said predetermined value so that the unidirectional high potential and the current flow are decreased.

2. Apparatus as set forth in claim 1, wherein the input power to said source comprises an a.c. voltage, said monitoring and controlling means connecting all of the cycles of the a.c. voltage to said source input upon the current flow to said electrode having less than said predetermined value, and cyclically interrupting application of full cycles of the a.c. voltage to said source input upon the current flow to said electrode having at least said predetermined value.

3. Apparatus as set forth in claim 1, wherein the input power to said source comprises an a.c. voltage, said monitoring and controlling means connecting all cycles of the a.c. voltage to said source input upon the current flow to said electrode having less than said predetermined value, and cyclically connecting only a selected proportion of the full cycles of the a.c. voltage to said source input upon the current flow to said electrode having at least said predetermined value.

4. Apparatus as set forth in claim 1, wherein the input power to said source comprises an a.c. voltage, said monitoring and controlling means connecting all cycles of the a.c. voltage to said source input upon the current flow to said electrode having less than said predetermined value, and cyclically connecting only one out of a selected number of the full cycles to said source input upon the current flow to said electrode having at least said predetermined value.

5. Apparatus as set forth in claim 3, said monitoring and controlling means including means for sensing the magnitude of current flow to said charging electrode and for generating a sensing signal having a first or second value in accordance with the magnitude being less than or at least equal to, respectively, said predetermined value, and means responsive to said first value of said sensing signal for connecting all cycles of the a.c. voltage to said source input and to said second value of said sensing signal for connecting only said selected proportion of the cycles to said source input.

6. Apparatus as set forth in claim 5, said means responsive including counter circuit means for receiving said sensing signal, and switching circuit means under control of said counter circuit means, said switching circuit means controlling application of the a.c. voltage to said source input, said counter circuit means enabling said switching circuit means to connect all cycles of the a.c. voltage with said source input whenever said sensing signal has said first value and enabling said switching circuit means to periodically connect only said selected proportion of the cycles to said source input whenever said sensing signal has said second value.

7. Apparatus as set forth in claim 6, including synchronizing circuit means for applying clock pulses to a clock input to said counter circuit means at the frequency of the a.c. voltage, said sensing signal being applied to a reset/enable input to said counter circuit means and said counter circuit means having outputs coupled with said switching circuit means for controlling operation thereof, said counter circuit means being responsive to said first value of said sensing signal to remain in a reset state whereat its outputs control said switching circuit means to connect all cycles of the a.c. voltage with said source input, said counter circuit means being responsive to said second value of said sensing signal to be in an enabled state whereat said clock pulses cyclically advance said counter circuit means through a count during which its outputs control said switching circuit means to connect only said selected proportion of the cycles or the a.c. voltage with said source input.

8. Apparatus as set forth in claim 7, wherein said clock pulses are synchronized with the a.c. voltage cycles to advance said counter circuit means, when the same is enabled, only at the zero crossing points of the a.c. voltage, whereby said switching circuit means is controlled to connect cycles of the a.c. voltage with said source input only at zero crossing points of the a.c. voltage.

9. Apparatus as in claim 7, wherein said counter circuit means, when enabled, is cyclically advanced through a selected count, and controls said switching circuit means to apply to said source input only one cycle of the a.c. voltage out of each number of cycles equal to said selected count.

10. Apparatus as set forth in claim 7, said switching circuit means including a triac in circuit with said source input and the a.c. voltage for controlling connection of the a.c. voltage to said source input, and a photocoupled SCR coupled with said counter circuit means for being rendered conductive thereby whenever cycles of the a.c. voltage are to be connected with said source input, said triac being coupled with said photocoupled SCR for being rendered conductive whenever said photocoupled SCR is rendered conductive.

11. A method of electrostatically depositing coating material on articles in an electrostatic field generated by a unidirectional high potential between a charging electrode and another electrode comprising at least one of the articles, wherein the distance between the charging electrode and the other electrode is subject to variations which can cause a change in potential gradient between the charging electrode and the other electrode and a change in a current flow to the charging electrode, comprising the steps of applying input power to a power supply for generating the unidirectional high potential at an output therefrom; applying the unidirectional high potential to the charging electrode to generate the electrostatic field; atomizing coating material into the electrostatic field for movement toward the other electrode in response to the field; monitoring the value of the current flow to the charging electrode; and cyclically interrupting connection of input power with the power supply whenever the charging electrode current flow is at least equal to a predetermined value to apply only a portion and less than all of the input power to the power supply, whereby the magnitude of the unidirectional high potential output from the power supply and the current flow to the charging electrode are controlled.

12. A method as in claim 11, wherein said controlling step comprises continuously connecting input power with the power supply whenever the charging electrode current flow is less than the predetermined value, and cyclically interrupting connection of input power with the power supply whenever the charging electrode current flow is at least equal to the predetermined value.

13. A method as in claim 12, wherein the input power is an a.c. voltage and said cyclically interrupting step comprises cyclically interrupting connection of a selected number of full cycles of the a.c. voltage with the power supply.

14. A method as in claim 12, wherein the input power is an a.c. voltage and said cyclically interrupting step comprises periodically interrupting connection of a selected proportion of the full cycles of the a.c. voltage with the power supply.

* * * * *